US010788270B2

(12) United States Patent
Nakamura et al.

(10) Patent No.: US 10,788,270 B2
(45) Date of Patent: Sep. 29, 2020

(54) COOLING DEVICE

(71) Applicant: NEC Platforms, Ltd., Kawasaki-shi, Kanagawa (JP)

(72) Inventors: Yasuhito Nakamura, Kanagawa (JP); Shunsuke Fujii, Kanagawa (JP)

(73) Assignee: NEC Platforms, Ltd., Kawasaki-shi, Kanagawa (JP)

( * ) Notice: Subject to any disclaimer, the term of this patent is extended or adjusted under 35 U.S.C. 154(b) by 75 days.

(21) Appl. No.: 15/768,306

(22) PCT Filed: Oct. 14, 2016

(86) PCT No.: PCT/JP2016/004592
§ 371 (c)(1),
(2) Date: Apr. 13, 2018

(87) PCT Pub. No.: WO2017/064871
PCT Pub. Date: Apr. 20, 2017

(65) Prior Publication Data
US 2018/0313612 A1 Nov. 1, 2018

(30) Foreign Application Priority Data

Oct. 15, 2015 (JP) .................................. 2015-203538

(51) Int. Cl.
*F28D 15/06* (2006.01)
*H05K 7/20* (2006.01)
(Continued)

(52) U.S. Cl.
CPC .............. *F28D 15/06* (2013.01); *F25B 43/00* (2013.01); *F28D 15/0266* (2013.01);
(Continued)

(58) Field of Classification Search
CPC .. F28D 15/06; F28D 15/0266; F28D 15/0275; H05K 7/20318; H05K 7/20309; F25B 2400/23
See application file for complete search history.

(56) References Cited

U.S. PATENT DOCUMENTS 4,314,601 A 2/1982 Giuffre et al.
9,874,406 B2 1/2018 Fuchs et al.
(Continued)

FOREIGN PATENT DOCUMENTS

DE 102014205086 B3 7/2015
EP 2816881 B1 10/2018
(Continued)

OTHER PUBLICATIONS

JP 2003240385A translation.*
(Continued)

*Primary Examiner* — Elizabeth J Martin
(74) *Attorney, Agent, or Firm* — Sughrue Mion, PLLC

(57) ABSTRACT

A refrigerant relay device 1300 is provided with a casing 1310, a first refrigerant inflow opening 1360, a first refrigerant outflow opening 1350, and refrigerant inflow piping 1370. The casing retains liquid-phase refrigerant and gas-phase refrigerant. The liquid-phase refrigerant is made to flow into the casing through the first refrigerant inflow opening. The gas-phase refrigerant is made to flow out to the outside of the casing through the first refrigerant outflow opening. In the refrigerant inflow piping, one end is connected to the first refrigerant inflow opening and an opening 1371 is formed at the other end. The liquid-phase refrigerant flowing into the first refrigerant inflow opening is made to flow into the casing through the refrigerant inflow piping from the opening. The opening is positioned so as to face the bottom part 1311 of the casing.

8 Claims, 8 Drawing Sheets

(51) Int. Cl.
  *F28D 15/02* (2006.01)
  *F25B 43/00* (2006.01)
(52) U.S. Cl.
  CPC .......... *F28D 15/0275* (2013.01); *H05K 7/20* (2013.01); *F25B 2400/01* (2013.01)

(56) References Cited

U.S. PATENT DOCUMENTS

| 2012/0090339 | A1 | 4/2012 | Ohlsson et al. |
| 2013/0312447 | A1 | 11/2013 | Inaba et al. |

FOREIGN PATENT DOCUMENTS

| JP | 54-077583 A | 6/1979 |
| JP | 55-176570 A | 12/1980 |
| JP | 60-056583 A | 4/1985 |
| JP | 61-172978 U | 10/1986 |
| JP | 08-145385 A | 6/1996 |
| JP | 2003-240385 A | 8/2003 |
| JP | 2004-349551 A | 12/2004 |
| JP | 2006-039916 A | 2/2006 |
| JP | 2009-8349 A | 1/2009 |
| JP | 2013-139908 A | 7/2013 |
| JP | 2014-122782 A | 7/2014 |
| JP | 2014-123634 A | 7/2014 |
| WO | 98/39605 A1 | 9/1998 |
| WO | 2015/072128 A1 | 5/2015 |

OTHER PUBLICATIONS

Communication dated May 17, 2019, from the European Patent Office in counterpart European Application No. 16855125.7.
International Search Report for PCT/JP2016/004592 dated Dec. 20, 2016 [PCT/ISA/210].
Written Opinion for PCT/JP2016/004592 dated Dec. 20, 2016 [PCT/ISA/237].
Decision to Grant a Patent for Japanese Patent Application No. 2015-203538 dated Jun. 1, 2017.
Notification of Reasons for Refusal Japanese Patent Application No. 2015-203538 dated Jun. 20, 2016.
Notification of Reasons for Refusal Japanese Patent Application No. 2015-203538 dated Nov. 25, 2016.
Written Opinion and Search Report dated Aug. 14, 2019 issued by the Intellectual Property Office of Singapore in counterpart application No. 11201802958Q.

* cited by examiner

COOLING DEVICE

CROSS REFERENCE TO RELATED APPLICATIONS

This application is a National Stage of International Application No. PCT/JP2016/004592 filed Oct. 14, 2016, claiming priority based on Japanese Patent Application No. 2015-203538 filed Oct. 15, 2015.

TECHNICAL FIELD

The present invention relates to a cooling device or the like and particularly relates to a cooling device or the like that, for example, cools a heating element by circulating refrigerant between an evaporator and a condenser.

BACKGROUND ART

In recent years, the role of data centers where servers and network devices for performing information processing are installed at a single place has increased due to expansion of Internet services and the like. In conjunction with an increase in the amount of information processed in data centers, power consumption at data centers has also increased.

In particular, electric power that air conditioners for cooling electronic devices, such as servers, consume constitutes a large part of the power consumption in a data center. For this reason, a reduction in the power consumption of air conditioners in a data center is required. In addition, application of a method in which emitted heat from electronic devices is transported directly to outdoors and radiated to outside air has been attempted.

As a method for transporting emitted heat from electronic devices, a method of using a phase change phenomenon of refrigerant is known. The method uses latent heat on the occasion of phase changes of refrigerant between a liquid-phase and a gas-phase because of a cycle between the evaporation and condensation of the refrigerant and has a characteristic in that the amount of heat transport is large. For this reason, the method of using the phase change phenomenon of refrigerant is expected to be effective for a reduction in the power consumption of air conditioners in a data center.

An example of a cooling device using such a phase change phenomenon of refrigerant is disclosed in PTL 1.

A technology described in PTL 1 cools heat from a heating element 35 by circulating refrigerant between a boiling cooler 15 (equivalent to an evaporator) and a condenser 30. In addition, a gas-liquid separator 20 is connected to the boiling cooler 15 and the condenser 30.

Liquid-phase refrigerant (liquid refrigerant) and gas-phase refrigerant (refrigerant vapor) flow into the gas-liquid separator 20 from the boiling cooler 15. The gas-liquid separator 20 allows liquid-phase refrigerant to flow out to the boiling cooler 15 via a return passage 23. The gas-liquid separator 20 also allows gas-phase refrigerant to flow out to the condenser 30 via a second cooler 25.

The gas-liquid separator 20 includes a float valve 21 for opening and closing the return passage 23. While a sufficient amount of liquid-phase refrigerant is retained in the gas-liquid separator 20, the float valve 21 opens the return passage 23 by means of the buoyancy of the liquid-phase refrigerant. On the other hand, when all liquid-phase refrigerant in the gas-liquid separator 20 has flowed out, the float valve 21 closes the return passage 23 by means of the gravity of the float valve 21 itself. This mechanism prevents gas-phase refrigerant in the gas-liquid separator 20 from flowing into the return passage 23.

Note that other technologies related to the present invention are also disclosed in, for example, PTLs 2 to 4.

CITATION LIST

Patent Literature

[PTL 1] JP 2004-349551 A
[PTL 2] WO 2015/072128 A
[PTL 3] JP 2014-122782 A
[PTL 4] JP 08-145385 A

SUMMARY OF INVENTION

Technical Problem

However, there is a possibility that, depending on the pressure of gas-phase refrigerant flowing into the gas-liquid separator 20 from the boiling cooler 15, the float valve 21 is floated up and the return passage 23 is unexpectedly opened. If the return passage 23 is opened when all liquid-phase refrigerant in the gas-liquid separator 20 has flowed out, gas-phase refrigerant unexpectedly flows into the boiling cooler 15 via the return passage 23. There has been a problem in that, as a result of the above behavior, cooling efficiency of the heating element 35 is reduced.

An object of the present invention is to provide a cooling device etc. that enables heat from a heating element to be cooled efficiently.

Solution to Problem

A cooling device of the present invention includes: an evaporator that, upon receiving heat from a heating element, evaporates liquid-phase refrigerant retained internally by means of the heat of the heating element and allows gas-phase refrigerant to flow out; a condenser that condenses the gas-phase refrigerant flowing out of the evaporator and allows liquid-phase refrigerant to flow out; and a refrigerant relay device that is connected to the evaporator and the condenser, retains the gas-phase refrigerant flowing out of the evaporator and, in conjunction therewith, allows the gas-phase refrigerant to flow out to the condenser, and retains the liquid-phase refrigerant flowing out of the condenser and, in conjunction therewith, allows the liquid-phase refrigerant to flow out to the evaporator, wherein the refrigerant relay device includes: a casing that retains the liquid-phase refrigerant and the gas-phase refrigerant; a refrigerant inflow opening that allows the liquid-phase refrigerant flowing out of the condenser to flow into the casing therethrough; a refrigerant outflow opening that allows the gas-phase refrigerant retained inside the casing to flow out to the condenser therethrough; and a refrigerant inflow piping one end part of which is connected to the refrigerant inflow opening, at the other end part of which an opening part is formed, and that allows the liquid-phase refrigerant flowing into the refrigerant inflow opening to flow into the casing from the opening, and the opening part is disposed so as to face a bottom part of the casing.

A refrigerant relay device of the present invention includes: a casing that retains liquid-phase refrigerant and gas-phase refrigerant; a refrigerant inflow opening that allows the liquid-phase refrigerant to flow into the casing therethrough; a refrigerant outflow opening that allows the gas-phase refrigerant to flow out of the casing therethrough; and a refrigerant inflow piping one end part of which is connected to the refrigerant inflow opening, at the other end part of which an opening part is formed, and that allows the liquid-phase refrigerant flowing into the refrigerant inflow opening to flow into the casing from the opening part, wherein the opening part is disposed so as to face a bottom part of the casing.

Advantageous Effects of Invention

A cooling device or the like according to the present invention enables heat from a heating element to be cooled efficiently.

DESCRIPTION OF EMBODIMENTS

Example Embodiment

A configuration of a cooling device 1000 in an example embodiment of the present invention will be described.

Figure 1:
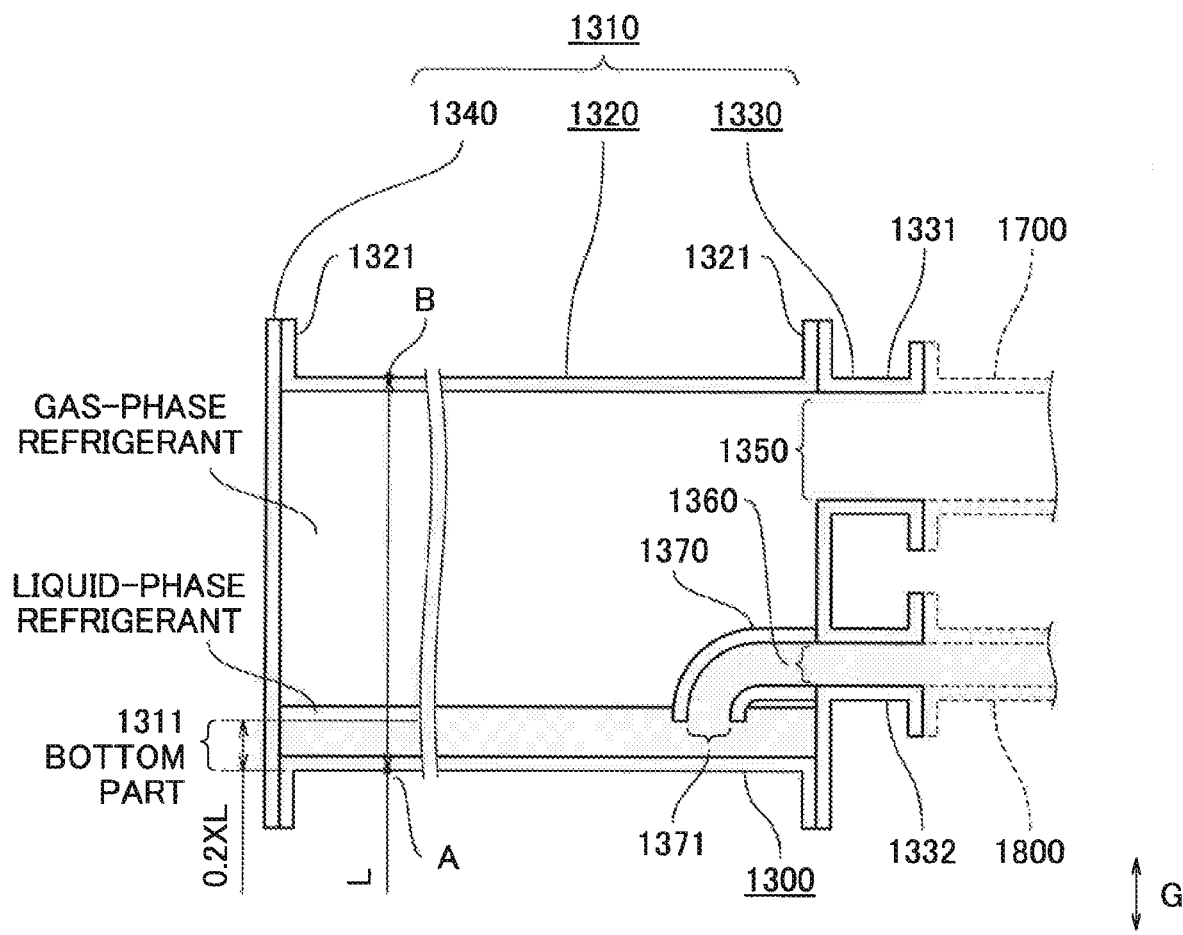
FIG. 1 is a cross-sectional view illustrating a configuration of a refrigerant relay device in an example embodiment of the present invention.
Figure 2:
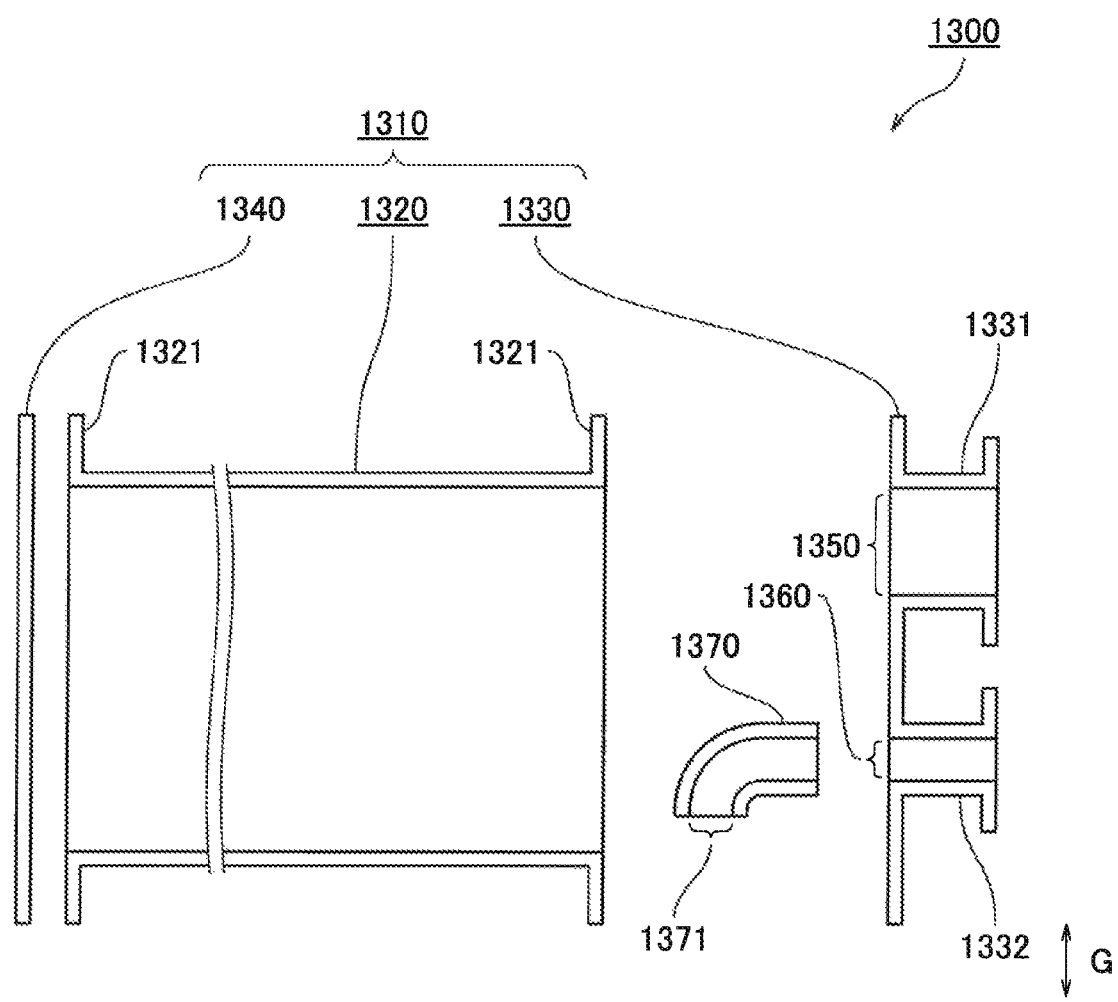
FIG. 2 is an exploded cross-sectional view illustrating the configuration of the refrigerant relay device in the example embodiment of the present invention in an exploded manner.

FIG. 1 is a cross-sectional view illustrating a configuration of a refrigerant relay device 1300 in the example embodiment of the present invention. FIG. 1 illustrates a cross-sectional view of the refrigerant relay device 1300 taken along a cross section including a central line CL1 of the refrigerant relay device 1300 illustrated in FIG. 4 and extending along the vertical direction G. FIG. 2 is an exploded cross-sectional view illustrating the configuration of the refrigerant relay device 1300 in an exploded manner. FIG. 2 illustrates the configuration of the refrigerant relay device 1300 sectioned along a cross section corresponding to the cross section in FIG. 1 in an exploded manner. In FIGS. 1 and 2, the configuration of the refrigerant relay device 1300 is illustrated with a middle part of the refrigerant relay device 1300 omitted for convenience.

Figure 3:
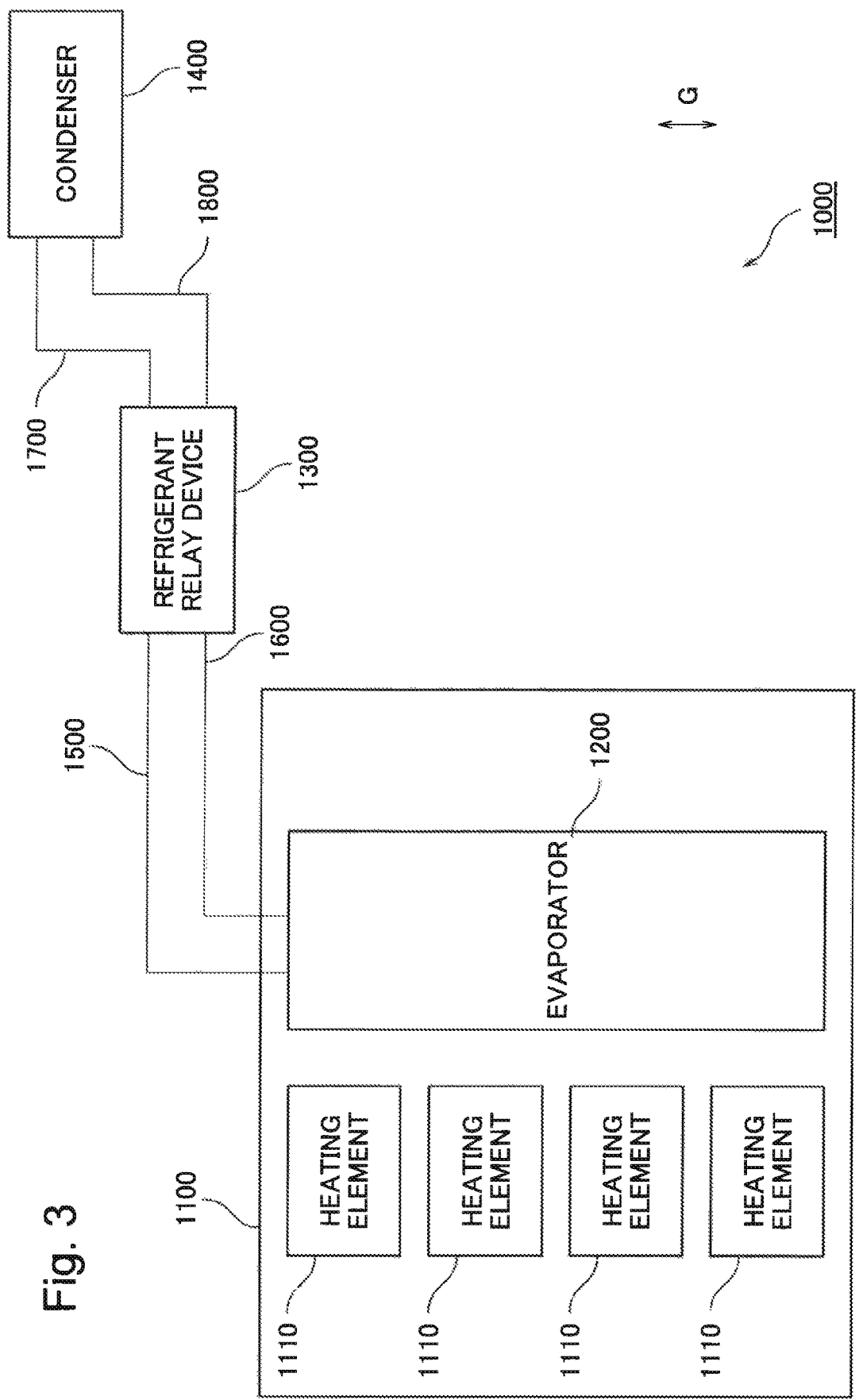
FIG. 3 is a diagram illustrating an outline of a configuration of a cooling device in the example embodiment of the present invention.
Figure 4:
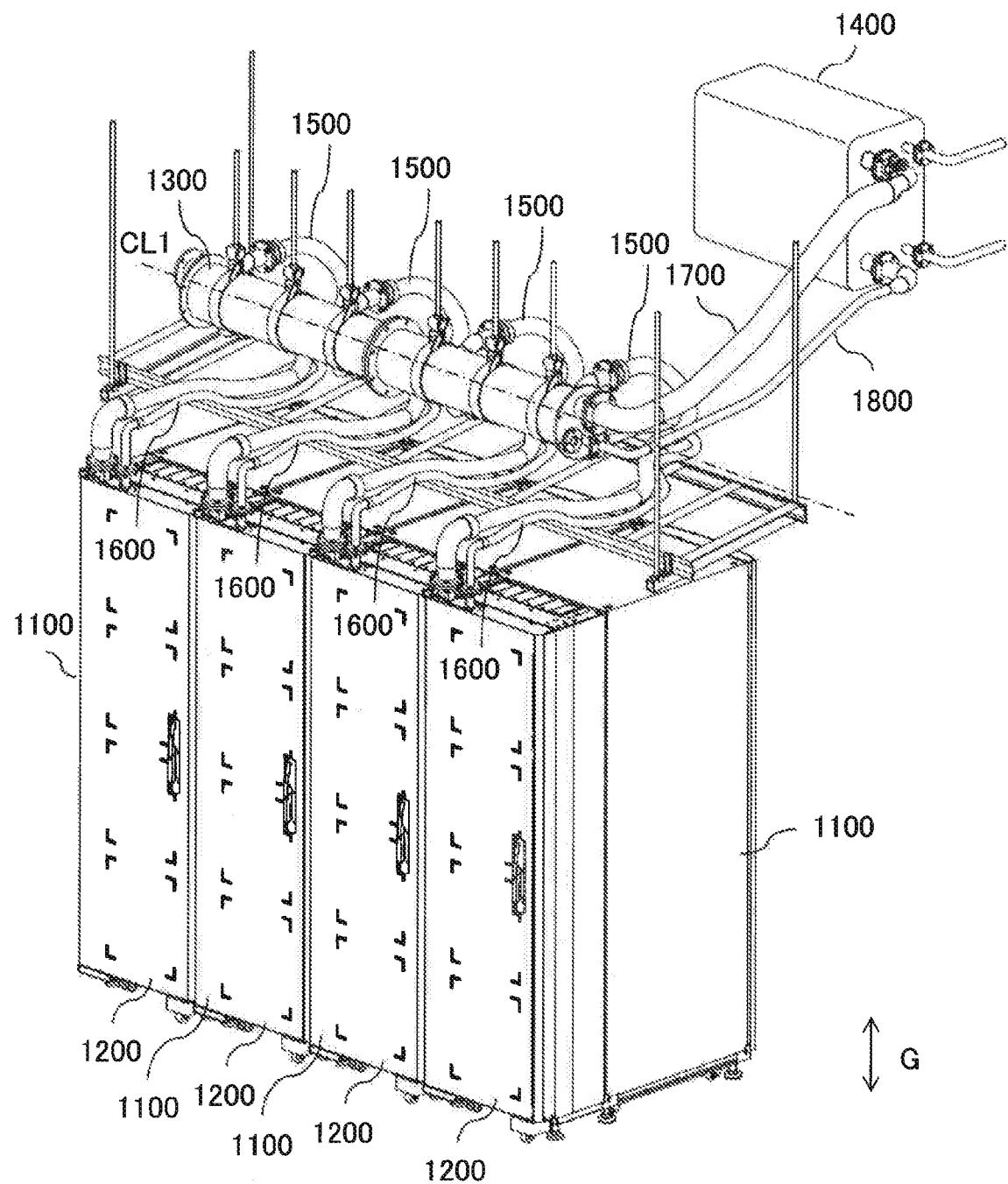
FIG. 4 is an external perspective view illustrating the configuration of the cooling device in the example embodiment of the present invention.

FIG. 3 is a diagram illustrating an outline of a configuration of the cooling device 1000. FIG. 4 is an external perspective view illustrating the configuration of the cooling device 1000. Note that, in FIG. 4, an example in which four racks 1100 in FIG. 3 are placed is illustrated. In addition, in FIG. 4, an example in which evaporators 1200, which are mounted on the respective racks 1100, are connected to a single refrigerant relay device 1300 is illustrated.

Figure 5:
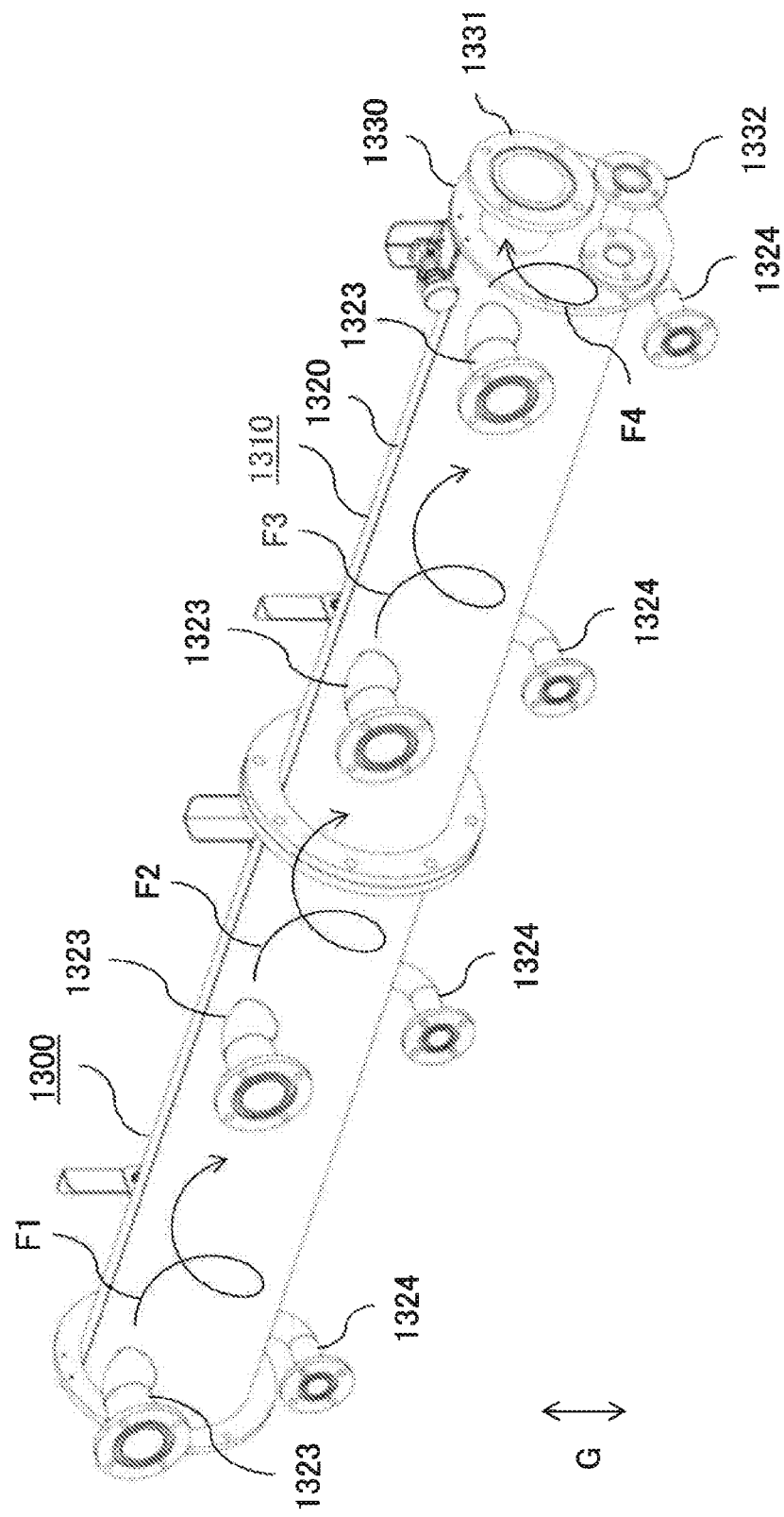
FIG. 5 is an external perspective view illustrating the configuration of the refrigerant relay device in the example embodiment of the present invention.
Figure 6:
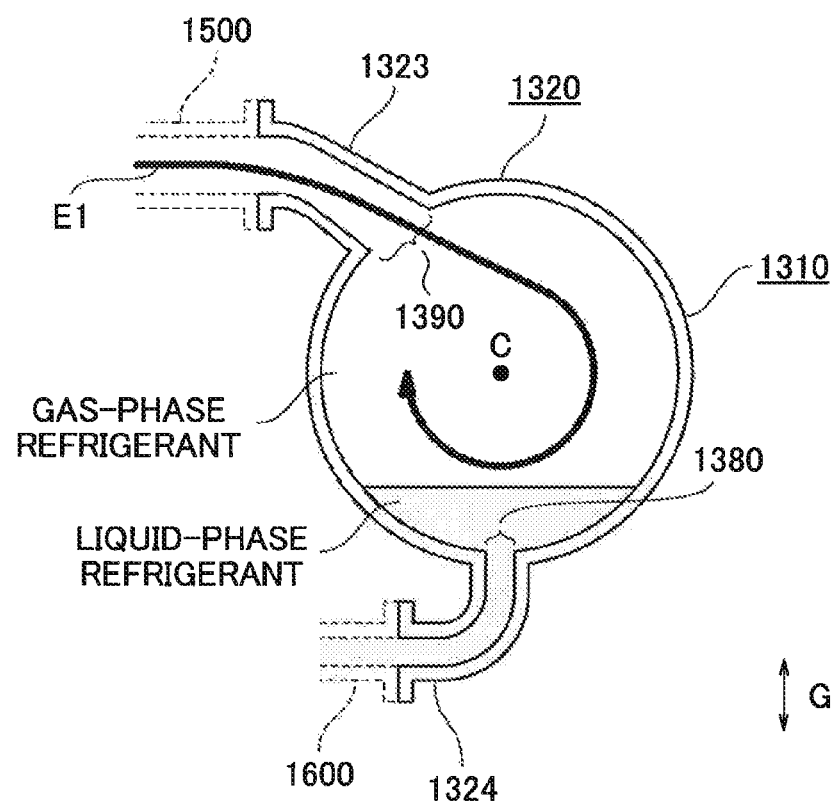
FIG. 6 is a cross-sectional view illustrating the configuration of the refrigerant relay device in the example embodiment of the present invention.

FIG. 5 is an external perspective view illustrating the configuration of the refrigerant relay device 1300. FIG. 6 is a cross-sectional view illustrating the configuration of the refrigerant relay device 1300. FIG. 6 is a cross-sectional view of the refrigerant relay device 1300 taken along a cross section that is perpendicular to the central line CL1 of the refrigerant relay device 1300 and includes a central line of a second vapor tube connecting part 1323 and a central line of a second liquid tube connecting part 1324. Note that, in FIGS. 1 to 6, the vertical direction G is illustrated. The cooling device 1000 is installed in, for example, a data center.

As illustrated in FIGS. 3 and 4, the cooling device 1000 includes at least an evaporator 1200, a refrigerant relay device 1300, and a condenser 1400. In FIG. 4, the cooling device 1000, as an example, includes four evaporators 1200, a refrigerant relay device 1300, and a condenser 1400. However, one or more and three or less or five or more evaporators 1200 may be placed in the cooling device 1000. Each evaporator 1200 and the refrigerant relay device 1300 are connected to each other by means of a first vapor tube 1500 and a first liquid tube 1600. The refrigerant relay device 1300 and the condenser 1400 are connected to each other by means of a second vapor tube 1700 and a second liquid tube 1800. In each rack 1100, heating elements 1110 are housed. Note that the first vapor tubes 1500, the first liquid tubes 1600, the second vapor tube 1700, the second liquid tube 1800, the racks 1100, and the heating elements 1110 are not essential components of the present invention. Therefore, the cooling device of the present invention may be configured with these components omitted.

As illustrated in FIG. 3, each rack 1100 houses one or more heating elements 1110. In the example in FIG. 3, four heating elements 1110 are housed in the rack 1100. However, one or more and three or less or five or more heating elements 1110 may be housed in the rack 1100.

Each heating element 1110 indicates a component the operation of which generates heat. The heating element 1110 is, for example, an electronic device or the like that includes a central processing unit (CPU), a large scale integration (LSI), and the like. In other words, the electronic device or the like generates heat as a heating element 1110 by performing various data processing.

The cooling device 1000 contains refrigerant that circulates among the evaporators 1200, the refrigerant relay device 1300, and the condenser 1400. In other words, insides of the evaporators 1200, the refrigerant relay device 1300, and the condenser 1400, cavities are formed. In addition, the refrigerant is confined in a state of being sealed in a closed space that is formed by the evaporators 1200, the refrigerant relay device 1300, the condenser 1400, the first vapor tubes 1500, the first liquid tubes 1600, the second vapor tube 1700, and the second liquid tube 1800. The refrigerant circulates among the evaporators 1200, the refrigerant relay device 1300, and the condenser 1400 in a state of being sealed via the first vapor tubes 1500, the first liquid tubes 1600, the second vapor tube 1700, and the second liquid tube 1800. The refrigerant is composed of, for example, polymer materials and the like and has a characteristic of evaporating at high temperatures and liquefying at low temperatures.

For the refrigerant, for example, hydro fluorocarbon (HFC) and hydro fluoroether (HFE) may be used as a refrigerant having a low boiling point.

As illustrated in FIG. 3, the evaporators 1200 are placed on the rear surface side of one or more heating elements 1110. Each evaporator 1200 is more preferably placed so as to come close to and face the heating elements 1110. This configuration enables the evaporators 1200 to receive heat from the heating elements 1110 efficiently.

As illustrated in FIGS. 3 and 4, the evaporators 1200 are connected to the refrigerant relay device 1300 by means of the first vapor tubes 1500 and the first liquid tubes 1600.

The evaporators 1200 are mounted on, for example, rear doors that are disposed on the rear-surface side of the racks 1100. Because of this configuration, opening each rear door enables adjustment of connection relationships between and maintenance work of the heating elements 1110 and the evaporator 1200 to be performed easily.

When receiving heat from the heating elements 1110, each evaporator 1200 evaporates refrigerant in a liquid-phase state (hereinafter, sometimes referred to as liquid-phase refrigerant), which is retained internally, by means of the heat from the heating elements 1110 and allows refrigerant in a gas-phase state (hereinafter, sometimes referred to as gas-phase refrigerant) to flow out. The gas-phase refrigerant flowing out of the evaporators 1200 flows into the condenser 1400 via the first vapor tubes 1500, the refrigerant relay device 1300, and the second vapor tube 1700.

As illustrated in FIGS. 3 and 4, the condenser 1400 is disposed at a higher position in the vertical direction G than the evaporators 1200. Because of this configuration, gravity facilitates the flow of liquid-phase refrigerant in the condenser 1400 to the evaporators 1200 via the second liquid tube 1800, the refrigerant relay device 1300, and the first liquid tubes 1600. The condenser 1400 is more preferably placed on the outside of the building of a data center and the like. This configuration enables the condenser 1400 to radiate heat received from the heating elements 1110 more efficiently.

As illustrated in FIGS. 3 and 4, the condenser 1400 is connected to the refrigerant relay device 1300 by means of the second vapor tube 1700 and the second liquid tube 1800.

The condenser 1400 receives gas-phase refrigerant flowing out of the evaporators 1200 via the refrigerant relay device 1300. The condenser 1400 condenses the gas-phase refrigerant flowing out of the evaporators 1200 and allows liquid-phase refrigerant to flow out. On this occasion, the condenser 1400 receives heat of the heating elements 1110 from the evaporators 1200 via the refrigerant and radiates the received heat of the heating elements 1110 to the outside air. In other words, the condenser 1400 exchanges heat of the heating elements 1110 absorbed by the refrigerant for heat of the outside air. The liquid-phase refrigerant flowing out of the condenser 1400 flows out to the evaporators 1200 via the second liquid tube 1800, the refrigerant relay device 1300, and the first liquid tubes 1600.

As illustrated in FIGS. 3 and 4, the refrigerant relay device 1300 is disposed at a higher position in the vertical direction G than the evaporators 1200. Because of this configuration, gravity facilitates the flow of liquid-phase refrigerant in the refrigerant relay device 1300 to the evaporators 1200 via the first liquid tubes 1600. In the example in FIG. 4, the refrigerant relay device 1300 is disposed above the racks 1100. The refrigerant relay device 1300 is fixed hung from the ceiling wall of the data center by means of, for example, hardware for mounting to a building. The refrigerant relay device 1300 is sometimes simply referred to as a reserve tank or a tank.

As illustrated in FIGS. 3 and 4, the refrigerant relay device 1300 is connected to the evaporators 1200 and the condenser 1400. More specifically, the refrigerant relay device 1300 is connected to the evaporators 1200 by means of the first vapor tubes 1500 and the first liquid tubes 1600. In addition, the refrigerant relay device 1300 is connected to the condenser 1400 by means of the second vapor tube 1700 and the second liquid tube 1800.

The refrigerant relay device 1300 retains gas-phase refrigerant flowing out of the evaporators 1200 and, in conjunction therewith, allows the gas-phase refrigerant to flow out to the condenser 1400. The refrigerant relay device 1300 also retains liquid-phase refrigerant flowing out of the condenser 1400 and, in conjunction therewith, allows the liquid-phase refrigerant to flow out to the evaporators 1200. This configuration enables the cooling device 1000 to cool heat of the heating elements 1110 by, while retaining a portion of liquid-phase refrigerant and gas-phase refrigerant in the refrigerant relay device 1300, circulating the refrigerant between the evaporators 1200 and the condenser 1300 with the refrigerant undergoing a phase change (from liquid-phase refrigerant to gas-phase refrigerant and vice versa).

Next, a specific configuration of the refrigerant relay device 1300 will be described.

As illustrated in FIG. 1, the refrigerant relay device 1300 includes at least a casing 1310, a first refrigerant outflow opening 1350, a first refrigerant inflow opening 1360, and a refrigerant inflow piping 1370.

As illustrated in FIGS. 1 and 2, the casing 1310 is configured including a cylindrical casing 1320, a first lid part 1330, and a second lid part 1340. The casing 1310 retains liquid-phase refrigerant and gas-phase refrigerant. The cylindrical casing 1320, the first lid part 1330, and the second lid part 1340 are made of a metal material, such as stainless steel.

The cylindrical casing 1320 has an opening at least at one end part and is formed into a cylindrical shape. In the example in FIGS. 1 and 2, openings are formed at both end parts of the cylindrical casing 1320. However, the second lid part 1340 may be attached integrally to the cylindrical casing 1320. In addition, in FIGS. 1 and 2, a casing formed into a circular cylindrical shape is exemplified as an example of the cylindrical casing 1320. However, the cylindrical casing 1320 may be formed into a polygonal cylindrical shape or an elliptic cylindrical shape.

At both end parts of the cylindrical casing 1320, flange parts 1321 are formed in a protruding manner. As illustrated in FIG. 1, to the flange part 1321 on the left side of the plane of paper in FIG. 1, the second lid part 1340 is attached by means of welding, fastening members (not illustrated, for example, screws, bolts, and nuts), or the like. To the flange part 1321 on the right side of the plane of paper in FIG. 1, the first lid part 1330 is attached by means of welding, fastening members (not illustrated, for example, screws, bolts, and nuts), or the like.

As illustrated in FIGS. 1 and 2, the first lid part 1330 and the second lid part 1340 are basically formed into circular disk shapes. In addition, as illustrated in FIG. 1, the first lid part 1330 and the second lid part 1340 are attached to the flange parts 1321 of the cylindrical casing 1320 by means of welding, fastening members (not illustrated, for example, screws, bolts, and nuts), or the like.

As illustrated in FIGS. 1 and 2, the first refrigerant outflow opening 1350 and the first refrigerant inflow opening 1360 are formed on the first lid part 1330 of the casing 1310.

The first refrigerant outflow opening 1350 is formed on the casing 1310 and allows gas-phase refrigerant to flow out to the outside of the casing 1310. More specifically, the first refrigerant outflow opening 1350 is formed on the casing 1310 to allow gas-phase refrigerant to flow out to the condenser 1400 placed outside the casing 1310. In the example in FIG. 1, the first refrigerant outflow opening 1350 is formed on the first lid part 1330. However, the first refrigerant outflow opening 1350 may be formed on the cylindrical casing 1320.

The first refrigerant inflow opening 1360 is formed on the casing 1310 and allows liquid-phase refrigerant to flow into the casing 1310. More specifically, the first refrigerant inflow opening 1360 is formed on the casing 1310 to allow liquid-phase refrigerant flowing out of the condenser 1400 to flow into the casing 1310. In the example in FIG. 1, the first refrigerant inflow opening 1360 is formed on the first lid part 1330. However, the first refrigerant inflow opening 1360 may be formed on the cylindrical casing 1320.

As illustrated in FIGS. 1, 2, 4, and 5, a first vapor tube connecting part 1331 and a first liquid tube connecting part 1332 are formed on the first lid part 1330 of the casing 1310.

As illustrated in FIGS. 1 and 2, the first vapor tube connecting part 1331 is connected to the first refrigerant outflow opening 1350. In addition, the second vapor tube 1700 (illustrated by dotted lines) is connected to the first vapor tube connecting part 1331. Note that, when the first refrigerant outflow opening 1350 is formed on the cylindrical casing 1320, the first vapor tube connecting part 1331 is formed on the cylindrical casing 1320.

As illustrated in FIGS. 1 and 2, the first liquid tube connecting part 1332 is connected to the first refrigerant inflow opening 1360. In addition, the second liquid tube 1800 (illustrated by dotted lines) is connected to the first liquid tube connecting part 1332. Note that, when the first refrigerant inflow opening 1360 is formed on the cylindrical casing 1320, the first liquid tube connecting part 1332 is formed on the cylindrical casing 1320.

As illustrated in FIG. 1, the refrigerant inflow piping 1370 is disposed on the inside of the casing 1310. In addition, as illustrated in FIG. 1, the refrigerant inflow piping 1370 is attached to the interior surface side (the left side of the plane of paper in FIGS. 1 and 2) of the first lid part 1330.

As illustrated in FIGS. 1 and 2, one end part of the refrigerant inflow piping 1370 is connected to the first refrigerant inflow opening 1360. At the other end part of the refrigerant inflow piping 1370, an opening part 1371 is formed. The refrigerant inflow piping 1370 allows liquid-phase refrigerant flowing into the first refrigerant inflow opening 1360 to flow into the casing 1310 through the opening part 1371. Note that, when the first refrigerant inflow opening 1360 is formed on the cylindrical casing 1320, the refrigerant inflow piping 1370 is attached to the interior surface of the cylindrical casing 1320.

As illustrated in FIG. 1, the opening part 1371 of the refrigerant inflow piping 1370 is disposed so as to face a bottom part 1311 of the casing 1310. In addition, the opening part 1371 is disposed in liquid-phase refrigerant in the casing 1310.

As used herein, the bottom part 1311 of the casing 1310 refers to a region of the casing 1310 on the lower side in the vertical direction G. For example, when, as illustrated in FIG. 1, length from a lowermost part A to an uppermost part B of the cylindrical casing 1320 (excluding the flange parts 1321) is denoted by L, a region of the cylindrical casing 1320 included in a range from the lowermost part A to a height of 0.2×L in the upward vertical direction G is referred to as the bottom part 1311 of the casing 1310. Note that the value of 0.2 in the expression 0.2×L is only an exemplification and the value is assumed to be appropriately changeable according to the shape and size of the cylindrical casing 1320.

As illustrated in FIG. 6, second refrigerant outflow openings 1380 and second refrigerant inflow openings 1390 are formed on the cylindrical casing 1320 of the casing 1310.

The second refrigerant outflow openings 1380 are formed on the casing 1310 and allow liquid-phase refrigerant to flow out to the outside of the casing 1310. More specifically, the second refrigerant outflow openings 1380 are formed on the casing 1310 to allow liquid-phase refrigerant to flow out to the evaporators 1200 placed outside the casing 1310.

The second refrigerant inflow openings 1390 are formed on the casing 1310 and allow gas-phase refrigerant to flow into the casing 1310. More specifically, the second refrigerant inflow openings 1390 are formed on the casing 1310 to allow gas-phase refrigerant flowing out of the evaporators 1200 to flow into the casing 1310.

As illustrated in FIGS. 4 to 6, the second vapor tube connecting parts 1323 and the second liquid tube connecting parts 1324 are formed on the cylindrical casing 1320 of the casing 1310. In FIGS. 4 and 5, as an exemplification, four second vapor tube connecting parts 1323 and four second liquid tube connecting parts 1324 are illustrated. However, it may suffice that one or more second vapor tube connecting parts 1323 and one or more second liquid tube connecting parts 1324 are formed.

As illustrated in FIG. 6, each second vapor tube connecting part 1323 is connected to one of the second refrigerant inflow openings 1390. In addition, one of the first vapor tubes 1500 (illustrated by dotted lines) is connected to the second vapor tube connecting part 1323. Each pair of a second vapor tube connecting part 1323 and a first vapor tube 1500 are, for example, connected to each other by means of welding, fastening members (not illustrated, for example, screws, bolts, and nuts), or the like. The second vapor tube connecting parts 1323 are equivalent to connecting parts between the first vapor tubes 1500 and the casing 1310.

As illustrated in FIG. 6, each second liquid tube connecting part 1324 is connected to one of the second refrigerant outflow openings 1380. In addition, one of the first liquid tubes 1600 (illustrated by dotted lines) is connected to the second liquid tube connecting part 1324. Each pair of a second liquid tube connecting part 1324 and a first liquid tube 1600 are, for example, connected to each other by means of welding, fastening members (not illustrated, for example, screws, bolts, and nuts), or the like. The second liquid tube connecting parts 1324 are equivalent to connecting parts between the first liquid tubes 1600 and the casing 1310.

As illustrated in FIG. 6, the extending direction of each second vapor tube connecting part 1323 (each connecting part between one of the first vapor tubes 1500 and the casing 1310) is set so as not to pass through a central part C in a cross section of the cylindrical casing 1320 when the cylindrical casing 1320 is cross-sectioned along a perpendicular direction to the central line CL1 of the cylindrical casing 1320. The central line CL1 of the cylindrical casing 1320 corresponds to the extending direction of the cylindrical casing 1320. The central part C in FIG. 6 corresponds to the central line CL1 illustrated in FIG. 4. In other words, the central line CL1 is set so as to pass through the central part C. In addition, each second vapor tube connecting part 1323 (each connecting part between one of the first vapor tubes 1500 and the casing 1310) is preferably disposed at a higher position in the vertical direction G than the central part C in the cross section of the cylindrical casing 1320.

Figure 7:
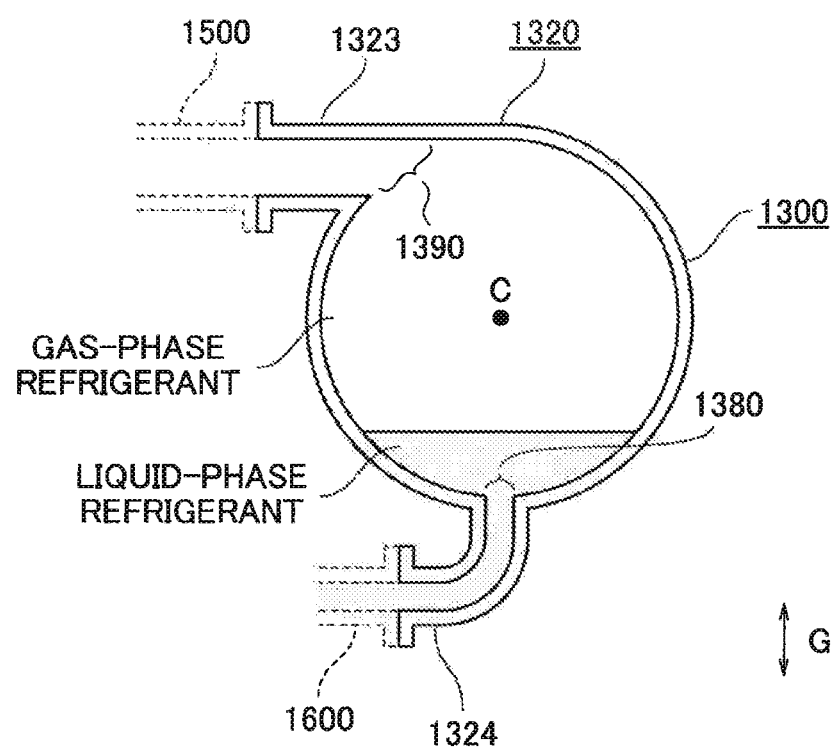
FIG. 7 is a cross-sectional view illustrating another configuration of the refrigerant relay device in the example embodiment of the present invention.

A first variation of the disposition positions of the second vapor tube connecting parts 1323 (connecting parts between the first vapor tubes 1500 and the casing 1310) will be described. FIG. 7 is a cross-sectional view illustrating another configuration of the refrigerant relay device 1300. In addition, FIG. 7, as with FIG. 6, illustrates a cross-sectional view of the refrigerant relay device 1300 taken along a cross section perpendicular to the central line CL1 of the refrigerant relay device 1300. Note that, in FIG. 7, the vertical direction G is illustrated.

As illustrated in FIG. 7, the extending direction of each second vapor tube connecting part 1323 (each connecting part between one of the first vapor tubes 1500 and the casing 1310) may be set along a tangent line to the outer perimeter circle of the cylindrical casing 1320. On this occasion, each second vapor tube connecting part 1323 (each connecting part between one of the first vapor tubes 1500 and the casing 1310) is preferably disposed at a higher position in the vertical direction G than the central part C in the cross section of the cylindrical casing 1320.

Figure 8:
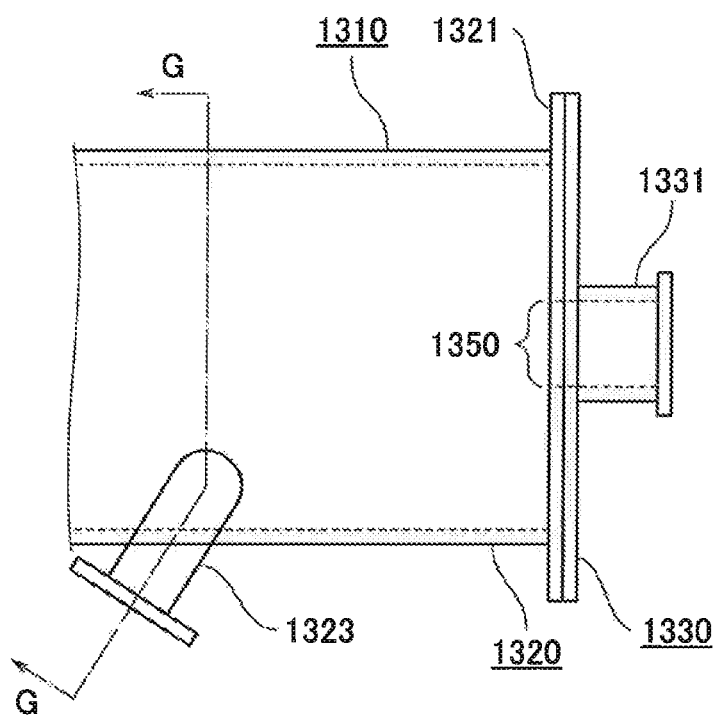
FIG. 8 is a top view illustrating still another configuration of the refrigerant relay device in the example embodiment of the present invention.

A second variation of the disposition positions of the second vapor tube connecting parts 1323 (connecting parts between the first vapor tubes 1500 and the casing 1310) will be described. FIG. 8 is a top view illustrating still another configuration of the refrigerant relay device 1300. In other words, FIG. 8 is an external top view of the refrigerant relay device 1300 as viewed from the upper side to the lower side in the vertical direction G.

The extending direction of each second vapor tube connecting part 1323 (each connecting part between one of the first vapor tubes 1500 and the casing 1310) is set so as not to pass through a central part C in a cross section of the cylindrical casing 1320 and, in conjunction therewith, set in a direction toward the side on which the first refrigerant outflow opening 1350, formed on the first lid part 1330, is disposed, as illustrated in FIG. 8. In other words, the cross section G-G in FIG. 8 includes a configuration equivalent to that in FIG. 6. In addition, each second vapor tube connecting part 1323 is disposed as illustrated in FIG. 8.

Next, an operation of the cooling device 1000 will be described.

When the heating elements 1110 operate, the heating elements 1110 generate heat. The evaporators 1200 of the cooling device 1000 receive the heat of the heating elements 1110. Each evaporator 1200 evaporates liquid-phase refrigerant retained inside the evaporator 1200 by means of the heat of the heating elements 1110 and generates gas-phase refrigerant.

The evaporators 1200 allow the gas-phase refrigerant to flow out to the condenser 1400 via the first vapor tubes 1500, the refrigerant relay device 1300, and the second vapor tube 1700. On this occasion, a portion of the gas-phase refrigerant is retained in the refrigerant relay device 1300. In addition, a portion of the gas-phase refrigerant retained in the refrigerant relay device 1300 is cooled in the refrigerant relay device 1300 and undergoes a phase change to liquid-phase refrigerant. As a result, a portion of the liquid-phase refrigerant is retained in the refrigerant relay device 1300.

Next, when gas-phase refrigerant flowing out of the evaporators 1200 flows into the condenser 1400, the condenser 1400 condenses the flowing-in gas-phase refrigerant and generates liquid-phase refrigerant.

Subsequently, the condenser 1400 allows the liquid-phase refrigerant to flow out to the evaporators 1200 via the second liquid tube 1800, the refrigerant relay device 1300, and the first liquid tubes 1600. On this occasion, a portion of the liquid-phase refrigerant is retained in the refrigerant relay device 1300.

In this way, the cooling device 1000 cools heat of the heating elements 1110 by, while retaining a portion of liquid-phase refrigerant and gas-phase refrigerant in the refrigerant relay device 1300, circulating refrigerant between the evaporators 1200 and the condenser 1300 with the refrigerant undergoing a phase change (from liquid-phase refrigerant to gas-phase refrigerant and vice versa).

As described above, interposing the refrigerant relay device 1300 between the evaporators 1200 and the condenser 1400 enables the amount of refrigerant in the evaporators 1200 and the condenser 1400 to be properly adjusted. Note that, when the amount of refrigerant supplied to the evaporators 1200 and the condenser 1400 is excessive, the cooling performed by the cooling device 1000 becomes mere liquid cooling that uses, instead of latent heat, sensible heat, by which only a small amount of heat is transported. When, conversely, the amount of refrigerant supplied to the evaporators 1200 and the condenser 1400 is insufficient, reception of heat from the heating elements 1110 by means of phase change of the refrigerant cannot be performed. In addition, there is a case where, for example, liquid-phase refrigerant in the evaporators 1200 flows back through the first vapor tubes 1500 because of pressure of gas-phase refrigerant flowing into the refrigerant relay device 1300 from the evaporators 1200. In other words, there is a case where even liquid-phase refrigerant in the evaporators 1200 flows into the refrigerant relay device 1300 via the first vapor tubes 1500. Even in such a case, the disposition of the refrigerant relay device 1300 causes the liquid-phase refrigerant flowing in via the first vapor tubes 1500 from the evaporators 1200 to be retained in the refrigerant relay device 1300. As a result, it is possible to prevent liquid-phase refrigerant in the evaporators 1200 from flowing into the condenser 1400.

As illustrated in FIG. 1, the opening part 1371 of the refrigerant inflow piping 1370 is disposed so as to face the bottom part 1311 of the casing 1310. Because of this configuration, the cooling device 1000 and the refrigerant relay device 1300 enable the opening part 1371 of the refrigerant inflow piping 1370 to be immersed in liquid-phase refrigerant in the casing 1310 of the refrigerant relay device 1300 even when the amount of refrigerant retained inside the casing 1310 of the refrigerant relay device 1300 is small. As a result, the cooling device 1000 and the refrigerant relay device 1300 enable gas-phase refrigerant in the refrigerant relay device 1300 to be prevented from flowing out to the condenser 1400 via the second liquid tube 1800.

Therefore, the cooling device 1000 and the refrigerant relay device 1300 enable heat of the heating elements 1110 to be cooled efficiently.

In addition, as illustrated in FIG. 6, the extending direction of each second vapor tube connecting part 1323 (each connecting part between one of the first vapor tubes 1500 and the casing 1310) is set so as not to pass through a central part C in a cross section of the cylindrical casing 1320 when the cylindrical casing 1320 is cross-sectioned along a perpendicular direction to the central line CL1 of the cylindrical casing 1320. In this configuration, the extending direction of the cylindrical casing 1320 is aligned along the central line CL1 of the cylindrical casing 1320.

The above configuration causes gas-phase refrigerant flowing out of the evaporators 1200 to swirl around the central part C as indicated by an arrow E1 in FIG. 6. This phenomenon generates a swirl flow of gas-phase refrigerant inside the casing 1310. The swirl flow of gas-phase refrigerant flows toward the side on which the first refrigerant outflow opening 1350 is formed, where pressure is low. Because of this refrigerant flow, the cooling device 1000 and the refrigerant relay device 1300 may allow gas-phase refrigerant flowing out of the evaporators 1200 to flow out to the condenser 1400 via the first refrigerant outflow opening 1350 and the second vapor tube 1700 efficiently. Therefore, the cooling device 1000 and the refrigerant relay device 1300 enable heat of the heating elements 1110 to be cooled efficiently.

On the other hand, when, differing from the present example embodiment, the extending direction of the second vapor tube connecting part 1323 passes through the central part C, gas-phase refrigerant flowing out of the evaporators 1200 flows into the refrigerant relay device 1300 and, after passing the central part C, collides with the inner wall surface of the casing 1310 or the refrigerant liquid surface and diverges. For this reason, no swirl flow of gas-phase refrigerant as indicated by the arrow E1 in FIG. 6 is generated. In the case, flow of gas-phase refrigerant toward the side on which the first refrigerant outflow opening 1350 is formed in the refrigerant relay device 1300 becomes smaller than that in the example illustrated in FIG. 6, which reduces the transport efficiency of the gas-phase refrigerant.

Note that, when a plurality of second vapor tube connecting parts 1323 are formed on the cylindrical casing 1320, gas-phase refrigerant flowing into the refrigerant relay device 1300 from the respective second vapor tube connecting parts 1323 swirls around the central parts C, as illustrated by the arrow E1 in FIG. 6. Therefore, a swirl flow of gas-phase refrigerant is generated with respect to each second vapor tube connecting part 1323. A plurality of swirl flows of gas-phase refrigerant generated in this way, while successively combining into a single flow as indicated by F1 to F4 in FIG. 5, flow inside the casing 1310 toward the side on which the first refrigerant outflow opening 1350 is formed, where pressure is low. Therefore, the refrigerant relay device 1300 may allow gas-phase refrigerant flowing out of the evaporators 1200 to flow out to the condenser 1400 via the first refrigerant outflow opening 1350 and the second vapor tube 1700 more efficiently. As a result, the cooling device 1000 and the refrigerant relay device 1300 enable heat of the heating elements 1110 to be cooled efficiently.

The extending direction of each of the plurality of second vapor tube connecting parts 1323 (connecting parts between the first vapor tubes 1500 and the casing 1310) may also be set in a direction toward the side on which the first refrigerant outflow opening 1350 is formed, as illustrated in FIG. 8.

In the case, since a plurality of swirl flows of gas-phase refrigerant each of which is generated for each second vapor tube connecting part 1323, while flowing toward the side on which the first refrigerant outflow opening 1350 is formed, successively combine into a single flow more efficiently, the fluid pressure of gas-phase refrigerant on the side on which the first refrigerant outflow opening 1350 is formed may be increased to a higher level.

As described above, the cooling device 1000 in the example embodiment of the present invention includes the evaporators 1200, the condenser 1400, and the refrigerant relay device 1300.

When receiving heat from the heating elements 1110, each evaporator 1200 evaporates liquid-phase refrigerant, which is retained internally, by means of the heat from the heating elements 1110 and allows gas-phase refrigerant to flow out. The condenser 1400 condenses the gas-phase refrigerant flowing out of the evaporators 1200 and allows liquid-phase refrigerant to flow out. The refrigerant relay device 1300 is connected to the evaporators 1200 and the condenser 1400. The refrigerant relay device 1300 retains gas-phase refrigerant flowing out of the evaporators 1200 and, in conjunction therewith, allows the gas-phase refrigerant to flow out to the condenser 1400. The refrigerant relay device 1300 also retains liquid-phase refrigerant flowing out of the condenser 1400 and, in conjunction therewith, allows the liquid-phase refrigerant to flow out to the evaporators 1200.

The refrigerant relay device 1300 also includes the casing 1310, the first refrigerant inflow opening 1360, the first refrigerant outflow opening 1350, and the refrigerant inflow piping 1370.

The casing 1310 retains liquid-phase refrigerant and gas-phase refrigerant. The first refrigerant inflow opening 1360 allows liquid-phase refrigerant to flow into the casing 1310 therethrough. The first refrigerant outflow opening 1350 allows gas-phase refrigerant to flow out to the outside of the casing 1310 therethrough. The refrigerant inflow piping 1370 has one end part thereof connected to the first refrigerant inflow opening 1360 and the opening part 1371 formed at the other end part thereof. The refrigerant inflow piping 1370 allows liquid-phase refrigerant flowing into the first refrigerant inflow opening 1360 to flow into the casing 1310 from the opening part 1371. The opening part 1371 is disposed so as to face the bottom part 1311 of the casing 1310.

As described above, the opening part 1371 of the refrigerant inflow piping 1370 is disposed so as to face the bottom part 1311 of the casing 1310. Because of this configuration, the cooling device 1000 and the refrigerant relay device 1300 enable the opening part 1371 of the refrigerant inflow piping 1370 to be immersed in liquid-phase refrigerant retained at the bottom part 1311 of the casing 1310 of the refrigerant relay device 1300 even when the amount of refrigerant retained inside the casing 1310 of the refrigerant relay device 1300 is small. As a result, the cooling device 1000 and the refrigerant relay device 1300 enable gas-phase refrigerant in the casing 1310 to be prevented from flowing out to the outside of the casing 1310 from the first refrigerant inflow opening 1360 in a reverse manner. Thus, the cooling device 1000 and the refrigerant relay device 1300 enable gas-phase refrigerant in the refrigerant relay device 1300 to be prevented from flowing out to the condenser 1400 via the second liquid tube 1800.

Therefore, the cooling device 1000 and the refrigerant relay device 1300 enable heat of the heating elements 1110 to be cooled efficiently.

As described afore, the cooling device 1000 and the refrigerant relay device 1300 enable the opening part 1371 of the refrigerant inflow piping 1370 to be immersed in liquid-phase refrigerant in the casing 1310 of the refrigerant relay device 1300 even when the amount of refrigerant retained inside the casing 1310 of the refrigerant relay device 1300 is small. As a result, the cooling device 1000 and the refrigerant relay device 1300 enable the amount of liquid-phase refrigerant retained inside the refrigerant relay device 1300 to be decreased to a smaller amount than that in the case where the refrigerant inflow piping 1370 is not disposed. Since the retention capacity of refrigerant in the refrigerant relay device 1300 may also be relatively decreased, the refrigerant relay device 1300 may be relatively miniaturized. Therefore, the cooling device 1000 enables the casing of the refrigerant relay device 1300 to be miniaturized and heat of the heating elements 1110 to be cooled by means of a smaller amount of refrigerant.

In the cooling device 1000 and the refrigerant relay device 1300 in the example embodiment of the present invention, the other end part of the refrigerant inflow piping 1370 may be formed so as to extend toward the bottom part 1311 of the casing 1310. This configuration enables the opening part 1371 formed at the other end part of the refrigerant inflow piping 1370 to be immersed in liquid-phase refrigerant retained at the bottom part 1311 of the casing 1310 of the refrigerant relay device 1300 more surely.

In the cooling device 1000 and the refrigerant relay device 1300 in the example embodiment of the present invention, the other end part of the refrigerant inflow piping 1370 may be formed so as to extend in the lower vertical direction. This configuration enables the opening part 1371 formed at the other end part of the refrigerant inflow piping 1370 to be immersed in liquid-phase refrigerant retained at the bottom part 1311 of the casing 1310 of the refrigerant relay device 1300 more surely.

In the cooling device 1000 and the refrigerant relay device 1300 in the example embodiment of the present invention, the casing 1310 includes the cylindrical casing 1320 and the first lid part 1330. The cylindrical casing 1320 is formed into a cylindrical shape and has an opening at least at one end part thereof. On the first lid part 1330, the first refrigerant inflow opening 1360 is formed. The first lid part 1330 closes the opening of the cylindrical casing 1320. One end part of the refrigerant inflow piping 1370 is attached to the first refrigerant inflow opening 1360 of the first lid part 1330.

As described above, the casing 1310 is configured so as to be disassembled into the cylindrical casing 1320 and the first lid part 1330. Because of this configuration, by attaching one end part of the refrigerant inflow piping 1370 at the first refrigerant inflow opening 1360 of the first lid part 1330, the connection between the one end part of the refrigerant inflow piping 1370 and the first refrigerant inflow opening 1360 may be achieved easily. Combining the first lid part 1330 to which the refrigerant inflow piping 1370 is attached with the cylindrical casing 1320 enables the refrigerant inflow piping 1370 to be disposed inside the casing 1310 easily.

In the cooling device 1000 and the refrigerant relay device 1300 in the example embodiment of the present invention, the casing 1310 includes the cylindrical casing 1320 and the first lid part 1330. The cylindrical casing 1320 is formed into a cylindrical shape and has an opening at least at one end part thereof. The first lid part 1330 closes the opening of the cylindrical casing 1320. One or more first vapor tubes 1500 are connected to the cylindrical casing 1320. The one or more first vapor tubes 1500 allow gas-phase refrigerant to flow into the casing 1310. More specifically, the one or more first vapor tubes 1500 allow gas-phase refrigerant flowing out of the evaporators 1200 to flow into the casing 1310.

On this occasion, the extending direction of each second vapor tube connecting part 1323 (each connecting part between one of the first vapor tubes 1500 and the casing 1310) is set so as not to pass through a central part C in a cross section of the cylindrical casing 1320 when the cylindrical casing 1320 is cross-sectioned along a perpendicular direction to the extending direction (parallel with the central line CL1) of the cylindrical casing 1320.

The above configuration causes gas-phase refrigerant flowing into the casing 1310 out of the evaporators 1200 to swirl around the central part C as indicated by the arrow E1 in FIG. 6. This phenomenon generates a swirl flow of gas-phase refrigerant inside the casing 1310. The swirl flow of gas-phase refrigerant flows toward the side on which the first refrigerant outflow opening 1350 is formed, where pressure is low. Because of this refrigerant flow, the refrigerant relay device 1300 may allow gas-phase refrigerant flowing in out of the first vapor tubes 1500 to flow out to the outside of the casing 1310 from the first refrigerant outflow opening 1350 efficiently. More specifically, the refrigerant relay device 1300 may allow gas-phase refrigerant flowing in out of the first vapor tubes 1500 to flow out to the condenser 1400 from the first refrigerant outflow opening 1350 efficiently. Therefore, the cooling device 1000 and the refrigerant relay device 1300 enable heat of the heating elements 1110 to be cooled efficiently.

In the cooling device 1000 and the refrigerant relay device 1300 in the example embodiment of the present invention, each second vapor tube connecting part 1323 (each connecting part between one of the first vapor tubes 1500 and the casing 1310) is disposed at a higher position in the vertical direction than a central part C in a cross section of the cylindrical casing 1320.

This configuration causes gravity to be added to gas-phase refrigerant flowing into the casing 1310 out of the evaporators 1200, which enables the fluid pressure of swirl flow of the gas-phase refrigerant to be increased to a higher level. Because of this effect, the refrigerant relay device 1300 may allow gas-phase refrigerant flowing in out of the first vapor tubes 1500 to flow out to the outside of the casing 1310 from the first refrigerant outflow opening 1350 more efficiently. More specifically, the refrigerant relay device 1300 may allow gas-phase refrigerant flowing in out of the first vapor tubes 1500 to flow out to the condenser 1400 from the first refrigerant outflow opening 1350 efficiently. Therefore, the cooling device 1000 and the refrigerant relay device 1300 enable heat of the heating elements 1110 to be cooled efficiently.

In the cooling device 1000 and the refrigerant relay device 1300 in the example embodiment of the present invention, the cylindrical casing 1320 is formed into a circular cylindrical shape. In addition, the extending direction of each second vapor tube connecting part 1323 (each connecting part between one of the first vapor tubes 1500 and the casing 1310) is set along a tangent line to the outer perimeter circle of the cylindrical casing 1320.

This configuration enables gas-phase refrigerant flowing into the casing 1310 out of the evaporators 1200 to flow into the casing 1310 along the inner wall having a curved surface in the cylindrical casing 1320 smoothly. The configuration also enables the maximum diameter of swirl flow of gas-phase refrigerant generated in the casing 1310 to be increased to the maximum extent possible. Therefore, the refrigerant relay device 1310 may allow gas-phase refrigerant flowing in out of the first vapor tubes 1500 to flow out to the outside of the casing 1310 from the first refrigerant outflow opening 1350 more efficiently.

In the cooling device 1000 and the refrigerant relay device 1300 in the example embodiment of the present invention, the extending direction of each second vapor tube connecting part 1323 (each connecting part between one of the first vapor tubes 1500 and the casing 1310) is further set in a direction toward the side on which the first refrigerant outflow opening 1350 is formed.

In other words, the extending direction of each second vapor tube connecting part 1323 (each connecting part between one of the first vapor tubes 1500 and the casing 1310) is set so as not to pass through a central part C in a cross section of the cylindrical casing 1320 and, in conjunction therewith, set in a direction toward the side on which the first refrigerant outflow opening 1350, formed on the first lid part 1330, is formed. This configuration enables a swirl flow of gas-phase refrigerant generated in the casing 1310 to be guided to the side on which the first refrigerant outflow opening 1350 is formed efficiently. Because of this effect, the refrigerant relay device 1300 may allow gas-phase refrigerant flowing in out of the first vapor tubes 1500 to flow out to the outside of the casing 1310 from the first refrigerant outflow opening 1350 more efficiently.

The present invention was described above through example embodiments (and examples) thereof, but the present invention is not limited to the above example embodiments (and examples). Various modifications that could be understood by a person skilled in the art may be applied to the configurations and details of the present invention within the scope of the present invention.

While the invention has been particularly shown and described with reference to example embodiments thereof, the invention is not limited to these embodiments. It will be understood by those of ordinary skill in the art that various changes in form and details may be made therein without departing from the spirit and scope of the present invention as defined by the claims.

In addition, all or part of the example embodiments described afore may be described as follows, but not limited thereto.

[Supplementary Note 1]

A refrigerant relay device, including:

a casing that retains liquid-phase refrigerant and gas-phase refrigerant;

a refrigerant inflow opening that allows the liquid-phase refrigerant to flow into the casing therethrough;

a refrigerant outflow opening that allows the gas-phase refrigerant to flow out of the casing therethrough; and a refrigerant inflow piping one end part of which is connected to the refrigerant inflow opening, at the other end part of which an opening part is formed, and that allows the liquid-phase refrigerant flowing into the refrigerant inflow opening to flow into the casing from the opening part, wherein the casing is formed into a cylindrical shape and includes:

a cylindrical casing that has an opening at least at one end part thereof; and a lid part on which the refrigerant inflow opening is formed and that closes the opening of the cylindrical casing, and the opening part is disposed so as to face a bottom part of the casing.

[Supplementary Note 2]

The refrigerant relay device according to supplementary note 1, wherein the other end part of the refrigerant inflow piping is formed so as to extend toward a bottom part of the casing.

[Supplementary Note 3]

The refrigerant relay device according to supplementary note 1 or 2, wherein the other end part of the refrigerant inflow piping is formed so as to extend in a lower vertical direction.

[Supplementary Note 4]

The refrigerant relay device according to any one of supplementary notes 1 to 3, wherein the one end part of the refrigerant inflow piping is attached to the refrigerant inflow opening of the lid part.

[Supplementary Note 5]

The refrigerant relay device according to supplementary note 4, wherein one or more vapor tubes that allow gas-phase refrigerant to flow into the casing are connected to the cylindrical casing, and an extending direction of each connecting part between one of the vapor tubes and the cylindrical casing is set so as not to pass through a central part in a cross section of the cylindrical casing when the cylindrical casing is cross-sectioned along a perpendicular direction to an extending direction of the cylindrical casing.

[Supplementary Note 6]

The refrigerant relay device according to supplementary note 5, wherein each connecting part between one of the first vapor tubes and the cylindrical casing is disposed at a higher position in the vertical direction than the central part in the cross section of the cylindrical casing.

[Supplementary Note 7]

The refrigerant relay device according to supplementary note 5 or 6, wherein the cylindrical casing is formed into a circular cylindrical shape, and an extending direction of each connecting part between one of the first vapor tubes and the cylindrical casing is set along a tangent line to an outer perimeter circle of the cylindrical casing.

[Supplementary Note 8]

The refrigerant relay device according to any one of supplementary notes 5 to 7, wherein an extending direction of each connecting part between one of the first vapor tubes and the cylindrical casing is further set in a direction toward a side on which the refrigerant outflow opening is formed.

[Supplementary Note 9]

A cooling device, including:

an evaporator that, upon receiving heat from a heating element, evaporates liquid-phase refrigerant retained internally by means of the heat of the heating element and allows gas-phase refrigerant to flow out;

a condenser that condenses the gas-phase refrigerant flowing out of the evaporator and allows liquid-phase refrigerant to flow out; and a refrigerant relay device according to any one of supplementary notes 1 to 8, wherein the refrigerant relay device is connected to the evaporator and the condenser, retains the gas-phase refrigerant flowing out of the evaporator and, in conjunction therewith, allows the gas-phase refrigerant to flow out to the condenser, and retains the liquid-phase refrigerant flowing out of the condenser and, in conjunction therewith, allows the liquid-phase refrigerant to flow out to the evaporator.

[Supplementary Note 10]

A cooling device, including:

an evaporator that, upon receiving heat from a heating element, evaporates liquid-phase refrigerant retained internally by means of the heat of the heating element and allows gas-phase refrigerant to flow out;

a condenser that condenses the gas-phase refrigerant flowing out of the evaporator and allows liquid-phase refrigerant to flow out; and a refrigerant relay device that is connected to the evaporator and the condenser, retains the gas-phase refrigerant flowing out of the evaporator and, in conjunction therewith, allows the gas-phase refrigerant to flow out to the condenser, and retains the liquid-phase refrigerant flowing out of the condenser and, in conjunction therewith, allows the liquid-phase refrigerant to flow out to the evaporator, wherein the refrigerant relay device includes:
a casing that retains the liquid-phase refrigerant and the gas-phase refrigerant;
a refrigerant inflow opening that allows the liquid-phase refrigerant flowing out of the condenser to flow into the casing therethrough;
a refrigerant outflow opening that allows the gas-phase refrigerant retained inside the casing to flow out to the condenser therethrough; and
a refrigerant inflow piping one end part of which is connected to the refrigerant inflow opening, at the other end part of which an opening part is formed, and that allows the liquid-phase refrigerant flowing into the refrigerant inflow opening to flow into the casing from the opening part, and
the opening part is disposed so as to face a bottom part of the casing.

[Supplementary Note 11]
The cooling device according to supplementary note 10, wherein
the other end part of the refrigerant inflow piping is formed so as to extend toward a bottom part of the casing.

[Supplementary Note 12]
The cooling device according to supplementary note 10 or 11, wherein
the other end part of the refrigerant inflow piping is formed so as to extend in a lower vertical direction.

[Supplementary Note 13]
The cooling device according to any one of supplementary notes 10 to 12, wherein
the casing is formed into a cylindrical shape and includes:
a cylindrical casing that has an opening at least at one end part thereof; and
a lid part on which the refrigerant inflow opening is formed and that closes the opening of the cylindrical casing, and
the one end part of the refrigerant inflow piping is attached to the refrigerant inflow opening of the lid part.

[Supplementary Note 14]
The cooling device according to supplementary note 13, wherein
one or more vapor tubes that allow gas-phase refrigerant flowing out of the evaporator to flow into the casing are connected to the cylindrical casing, and
an extending direction of each connecting part between one of the vapor tubes and the cylindrical casing is set so as not to pass through a central part in a cross section of the cylindrical casing when the cylindrical casing is cross-sectioned along a perpendicular direction to an extending direction of the cylindrical casing.

[Supplementary Note 15]
The cooling device according to supplementary note 14, wherein
each connecting part between one of the first vapor tubes and the cylindrical casing is disposed at a higher position in the vertical direction than the central part in the cross section of the cylindrical casing.

[Supplementary Note 16]
The cooling device according to supplementary note 14 or 15, wherein
the cylindrical casing is formed into a circular cylindrical shape, and
an extending direction of each connecting part between one of the first vapor tubes and the cylindrical casing is set along a tangent line to an outer perimeter circle of the cylindrical casing.

[Supplementary Note 17]
The cooling device according to any one of supplementary notes 14 to 16, wherein
an extending direction of each connecting part between one of the first vapor tubes and the cylindrical casing is further set in a direction toward a side on which the refrigerant outflow opening is formed.

[Supplementary Note 18]
A refrigerant relay device, including:
a casing that retains liquid-phase refrigerant and gas-phase refrigerant;
a refrigerant inflow opening that allows the liquid-phase refrigerant to flow into the casing therethrough;
a refrigerant outflow opening that allows the gas-phase refrigerant to flow out of the casing therethrough; and
a refrigerant inflow piping one end part of which is connected to the refrigerant inflow opening, at the other end part of which an opening part is formed, and that allows the liquid-phase refrigerant flowing into the refrigerant inflow opening to flow into the casing from the opening part, wherein
the opening part is disposed so as to face a bottom part of the casing.

[Supplementary Note 19]
The refrigerant relay device according to supplementary note 18, wherein
the other end part of the refrigerant inflow piping is formed so as to extend toward a bottom part of the casing.

[Supplementary Note 20]
The refrigerant relay device according to supplementary note 18 or 19, wherein
the other end part of the refrigerant inflow piping is formed so as to extend in a lower vertical direction.

[Supplementary Note 21]
The refrigerant relay device according to any one of supplementary notes 18 to 20, wherein
the casing is formed into a cylindrical shape and includes:
a cylindrical casing that has an opening at least at one end part thereof; and
a lid part on which the refrigerant inflow opening is formed and that closes the opening of the cylindrical casing, and
the one end part of the refrigerant inflow piping is attached to the refrigerant inflow opening of the lid part.

[Supplementary Note 22]
The refrigerant relay device according to supplementary note 21, wherein
one or more vapor tubes that allow gas-phase refrigerant to flow into the casing are connected to the cylindrical casing, and
an extending direction of each connecting part between one of the vapor tubes and the cylindrical casing is set so as not to pass through a central part in a cross section of the cylindrical casing when the cylindrical casing is cross-sectioned along a perpendicular direction to an extending direction of the cylindrical casing.

[Supplementary Note 23]
The refrigerant relay device according to supplementary note 22, wherein
each connecting part between one of the first vapor tubes and the cylindrical casing is disposed at a higher position in the vertical direction than the central part in the cross section of the cylindrical casing.

[Supplementary Note 24]
The refrigerant relay device according to supplementary note 22 or 23, wherein the cylindrical casing is formed into a circular cylindrical shape, and an extending direction of each connecting part between one of the first vapor tubes and the cylindrical casing is set along a tangent line to an outer perimeter circle of the cylindrical casing.

[Supplementary Note 25]

The refrigerant relay device according to any one of supplementary notes 22 to 24, wherein an extending direction of each connecting part between one of the first vapor tubes and the cylindrical casing is further set in a direction toward a side on which the refrigerant outflow opening is formed.

This application claims priority based on Japanese Patent Application No. 2015-203538, filed on Oct. 15, 2015, the entire disclosure of which is incorporated herein by reference.

REFERENCE SIGNS LIST

1000 Cooling device
1100 Rack
1110 Heating element
1200 Evaporator
1300 Coolant relay device
1310 Casing
1311 Bottom part
1320 Cylindrical casing
1321 Flange part
1323 Second vapor tube connecting part
1324 Second liquid tube connecting part
1330 First lid part
1331 First vapor tube connecting part
1332 First liquid tube connecting part
1340 Second lid part
1350 First refrigerant outflow opening
1360 First refrigerant inflow opening
1370 Coolant inflow piping
1371 Opening part
1400 Condenser
1500 First vapor tube
1600 First liquid tube
1700 Second vapor tube
1800 Second liquid tube

The invention claimed is:

1. A cooling device, comprising:
a plurality of evaporators that is formed for each of a plurality of heating elements, and which evaporates liquid-phase refrigerant retained internally by heat of the plurality of heating elements, and allows gas-phase refrigerant to flow out;
a condenser that condenses the gas-phase refrigerant from the plurality of evaporators to flow out as liquid-phase refrigerant;
a refrigerant relay device that is connected to the plurality of evaporators and the condenser, and retains the gas-phase refrigerant from the plurality of evaporators and allows the gas-phase refrigerant to flow out to the condenser, and retains liquid refrigerant from the condenser and allows the liquid refrigerant to flow out to the plurality of evaporators;
a second vapor tube for the gas-phase refrigerant connecting the refrigerant relay device and the condenser;
a second liquid tube for the liquid-phase refrigerant connecting the refrigerant relay device and the condenser;
a plurality of first vapor tubes for the gas-phase refrigerant connecting the refrigerant relay device and the plurality of evaporators; and
a plurality of first liquid tubes for the liquid-phase refrigerant connecting the refrigerant relay device and the plurality of evaporators; wherein
the refrigerant relay device comprises
a casing that retains the liquid-phase refrigerant and the gas-phase refrigerant, wherein the casing comprises:
a first vapor tube connecting part to which the second vapor tube is connected;
a first liquid tube connecting part to which the second liquid tube is connected;
a plurality of second vapor tube connecting parts to which the plurality of first vapor tubes are connected;
a plurality of second liquid tube connecting parts to which the plurality of first liquid tubes are connected;
a first refrigerant inflow opening that is formed on the first liquid tube connecting part, and allows the liquid-phase refrigerant to flow into the casing therethrough;
a first refrigerant outflow opening that is formed on the first vapor tube connecting part and allows the gas-phase refrigerant to flow out of the casing therethrough; and
a refrigerant inflow piping, one end part of which is connected to the first refrigerant inflow opening, at the other end part of which an opening part is formed, and that allows the liquid-phase refrigerant flowing into the first refrigerant inflow opening to flow into the casing from the opening part, wherein
the plurality of second vapor tube connecting parts and the plurality of second liquid tube connecting parts are formed at intervals so as to correspond to respective positions of the plurality of heating elements.

2. The cooling device according to claim 1, wherein the casing includes:
a cylindrical casing that is formed into a cylindrical shape and has an opening at least at one end part thereof; and
a lid part on which the first refrigerant inflow opening is formed and that closes the opening of the cylindrical casing, wherein
the opening part is disposed so as to face a bottom part of the casing, and
the other end part of the refrigerant inflow piping is formed so as to extend toward a bottom part of the casing.

3. The cooling device according to claim 2, wherein the other end part of the refrigerant inflow piping is formed so as to extend in a lower vertical direction.

4. The cooling device according to claim 2, wherein the one end part of the refrigerant inflow piping is attached to the first refrigerant inflow opening of the lid part.

5. The cooling device according to claim 4, wherein an extending direction of each connecting part between one of the first vapor tubes and the cylindrical casing is set so as not to pass through a central part in a cross section of the cylindrical casing when the cylindrical casing is cross-sectioned along a perpendicular direction to an extending direction of the cylindrical casing.

6. The cooling device according to claim 5, wherein each connecting part between one of the first vapor tubes and the cylindrical casing is disposed at a higher position in the vertical direction than the central part in the cross section of the cylindrical casing.

7. The cooling device according to claim 5, wherein the cylindrical casing is formed into a circular cylindrical shape, and an extending direction of each connecting part between one of the first vapor tubes and the cylindrical casing is set along a tangent line to an outer perimeter circle of the cylindrical casing.

8. The cooling device according to claim 5, wherein an extending direction of each connecting part between one of the first vapor tubes and the cylindrical casing is further set in a direction toward a side on which the first refrigerant outflow opening is formed.

\* \* \* \* \*